(12) United States Patent
Foote, Jr.

(10) Patent No.: US 7,390,722 B1
(45) Date of Patent: Jun. 24, 2008

(54) SYSTEM AND METHOD FOR USING AN OXIDATION PROCESS TO CREATE A STEPPER ALIGNMENT STRUCTURE ON SEMICONDUCTOR WAFERS

(75) Inventor: Richard Wendell Foote, Jr., Kennedale, TX (US)

(73) Assignee: National Semiconductor Corporation, Santa Clara, CA (US)

( * ) Notice: Subject to any disclaimer, the term of this patent is extended or adjusted under 35 U.S.C. 154(b) by 184 days.

(21) Appl. No.: 10/920,858

(22) Filed: Aug. 18, 2004

(51) Int. Cl.
*H01L 21/76* (2006.01)

(52) U.S. Cl. .............................. 438/401; 257/E23.179

(58) Field of Classification Search .................. 438/14, 438/18, 22, 34, 38, 48, 149, 400, 401, 403, 438/413, 439, 440, 443, 591, 598, 608, 653, 438/763, 765, 768–770, 778, 783
See application file for complete search history.

(56) References Cited

U.S. PATENT DOCUMENTS

| | | | | |
|---|---|---|---|---|
| 5,786,260 A | * | 7/1998 | Jang et al. | 438/401 |
| 5,963,816 A | * | 10/1999 | Wang et al. | 438/401 |
| 6,534,378 B1 | * | 3/2003 | Ramkumar et al. | 438/401 |
| 6,579,738 B2 | * | 6/2003 | Farrar et al. | 438/33 |

* cited by examiner

*Primary Examiner*—Michael S. Lebentritt
*Assistant Examiner*—Andre' Stevenson

(57) ABSTRACT

An oxidation process is used to produce a positional reference structure on a semiconductor wafer. A photolithographic mask layer used to define the positional reference structure can be combined with a photolithographic mask layer used to define an active device layer on the wafer, whereby both patterns can be printed in a single photolithographic operation. The same oxidation process used to produce an isolating oxide between active device regions of the active device layer can also be used to produce the positional reference structure.

20 Claims, 2 Drawing Sheets

SYSTEM AND METHOD FOR USING AN OXIDATION PROCESS TO CREATE A STEPPER ALIGNMENT STRUCTURE ON SEMICONDUCTOR WAFERS

TECHNICAL FIELD OF THE INVENTION

The invention relates generally to the manufacturing of semiconductor integrated circuits and, more particularly, to the processing of semiconductor wafers on which the integrated circuits are fabricated.

BACKGROUND OF THE INVENTION

Conventional semiconductor wafer processing utilizes stepper systems that execute a series of photolithographic operations during the wafer fabrication process. The operations of the stepper systems typically present bottlenecks in the wafer fabrication process.

It is therefore desirable to reduce the number of instances in which steppers are employed in semiconductor wafer processing.

SUMMARY OF THE INVENTION

According to the present invention, an oxidation process can be used to produce a positional reference structure on a semiconductor wafer. In some exemplary embodiments, the photolithographic mask layer used to define the positional reference structure is combined with a photolithographic mask layer used to define an active device layer on the wafer, so both patterns can be printed in a single photolithographic operation. In some embodiments, the same oxidation process used to produce an isolating oxide between active device regions of the active device layer is also used to produce the positional reference structure on the wafer.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation. A controller may be implemented in hardware, firmware or software, or some combination of at least two of the same. It should be noted that the functionality associated with a controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present invention and its advantages, reference is now made to the following description taken in conjunction with the accompanying drawings, in which like reference numerals represent like parts.

DETAILED DESCRIPTION OF THE INVENTION

Figure 1:
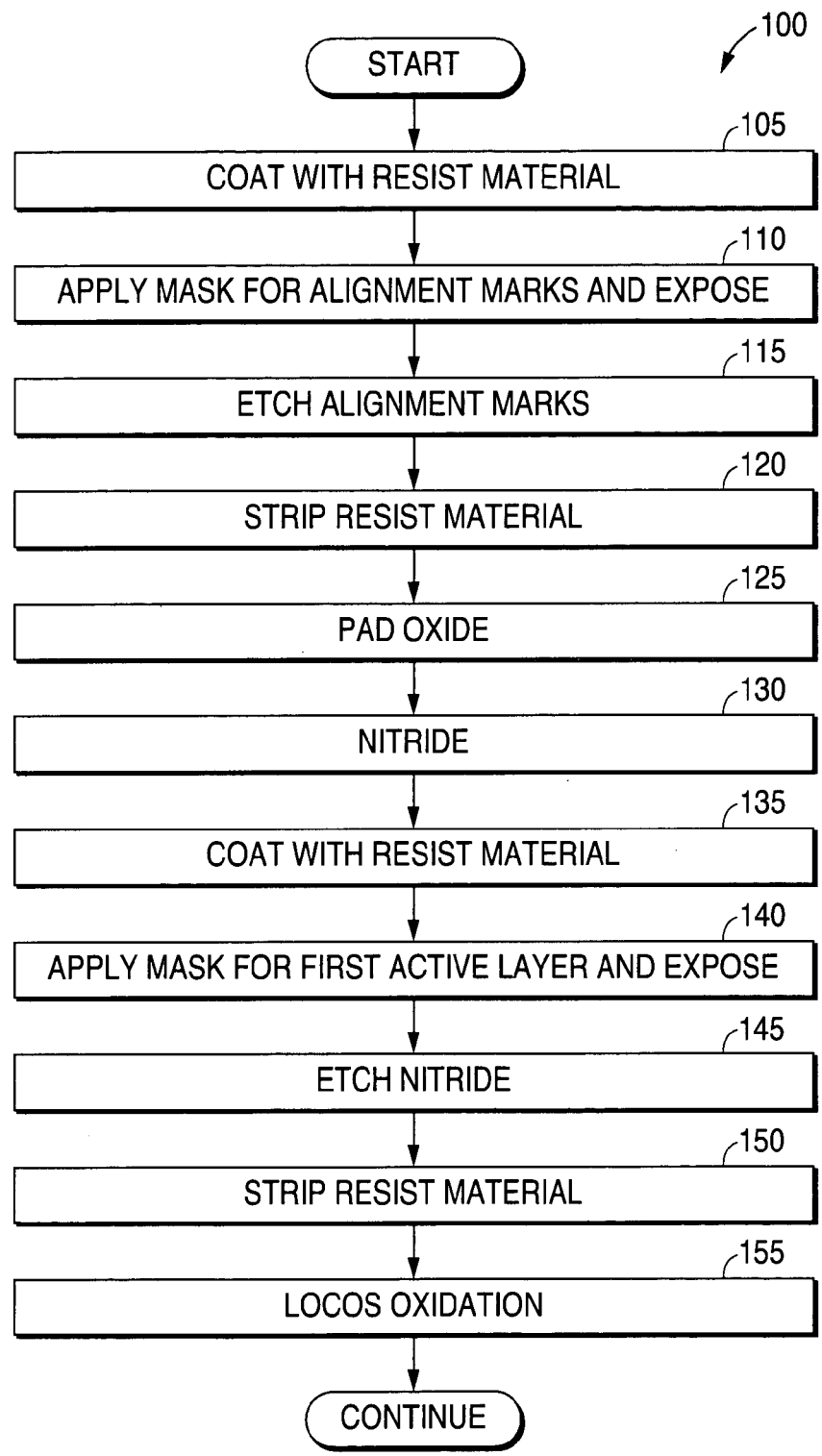
FIG. 1 illustrates a flow chart showing a semiconductor wafer processing operation according to the prior art.
Figure 2:
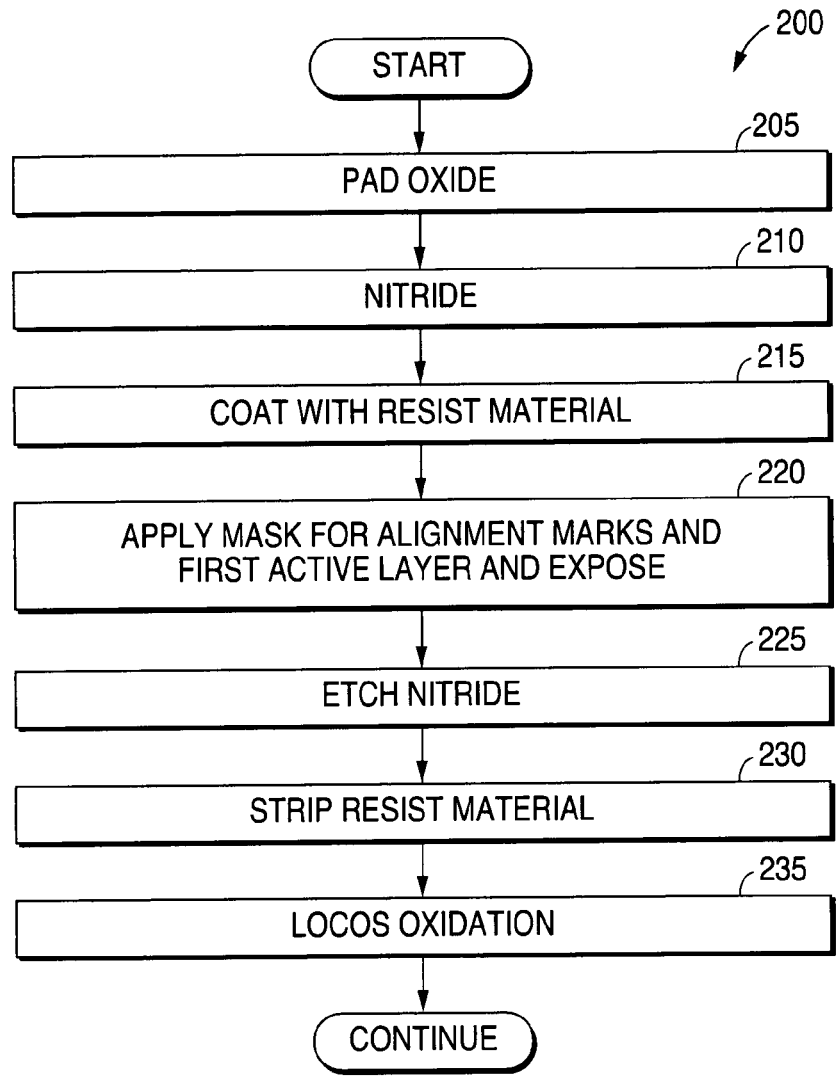
FIG. 2 illustrates a flow chart showing a semiconductor wafer processing operation according to an exemplary embodiment of the invention.
Figure 3:
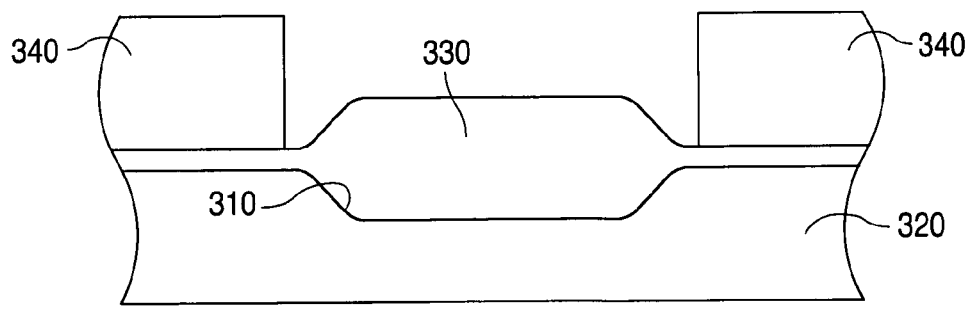
FIG. 3 illustrates a stepper alignment mark on a wafer according to an exemplary embodiment of the invention.

FIGS. 1 through 3, discussed below, and the various embodiments used to describe the principles of the present invention in this patent document are by way of illustration only and should not be construed in any way to limit the scope of the invention. Those skilled in the art will understand that the principles of the present invention may be implemented in any suitably arranged processing system.

FIG. 1 illustrates a flow chart 100 showing a prior art semiconductor wafer processing operation. Initially, the wafer is coated with photoresist material at step 105. At step 110, a mask for stepper alignment marks is applied, and the photoresist material is exposed. Stepper alignment marks are conventionally used by the stepper system to determine relative positioning of the wafer. This permits the stepper system to maintain alignment of the wafer with respect to the stepper and to maintain mutual alignment between the layers of the integrated circuits produced on the wafer. The stepper alignment marks are etched at step 115, and the remaining photoresist is stripped at step 120. At this point, fabrication of active devices begins. A pad oxide is applied at step 125, followed by a nitride at step 130. After coating with photoresist material at step 135, the mask for the first active device layer is applied at step 140, and the photoresist is exposed. The nitride is etched at step 145, after which the remaining photoresist material is stripped at step 150. Then, LOCOS oxidation is performed at step 155 in order to provide an isolating oxide between active device regions that were defined at step 140 and at step 145.

The prior art operations of FIG. 1 require a first photolithographic operation, illustrated generally at steps 105 through 120, to produce the stepper alignment marks, and a second photolithographic operation, illustrated generally at steps 135 through 150, to define the first active device layer.

Exemplary embodiments of the invention pattern a positional reference structure (such as a set of stepper alignment marks) on a semiconductor wafer in a photolithographic operation that is also used to pattern an active device layer on the wafer. FIG. 2 illustrates a flow chart 200 showing an exemplary embodiment of the method of the invention.

In the example shown in FIG. 2, stepper alignment marks are defined on the wafer in the same photolithographic operation that is used to define the first active device layer. In particular, the operations at step 205, step 210, and step 215 respectively correspond to the prior art operations at step 125, step 130 and step 135 in FIG. 1. At step 220, a mask for both the stepper alignment marks and the first active device layer is applied, and the photoresist is exposed. The nitride is then etched at step 225, and the photoresist material is stripped at step 230. At step 235, the LOCOS oxidation process provides isolation oxides between the active device regions that were defined at step 220 and step 225.

The LOCOS oxidation at step 235 also produces the stepper alignment marks that were defined at step 220 and step 225. In particular, portions of the semiconductor wafer at the alignment mark locations (as defined by the mask at step 220) are consumed during the LOCOS oxidation. More specifically, the LOCOS oxidation process produces recesses in the semiconductor (e.g., silicon) wafer at the locations of the alignment marks. These recesses have a depth of approximately forty six percent (46%) of the total thickness of the oxide that results from the LOCOS oxidation process at step 235. Inasmuch as the LOCOS oxidation process at step 235 produces the alignment marks as recesses in the wafer, it can be seen that the same LOCOS oxidation process that provides isolation oxides between the active device regions of the wafer also produces the stepper alignment marks. This in turn permits the patterns for the stepper alignment marks and the active device regions to be combined into a single mask, and defined on the wafer by a single photolithographic operation, such as illustrated generally at step 220 and step 225 in FIG. 2.

An example of a stepper alignment mark, provided as a recess produced by the LOCOS oxidation process at step 235 of FIG. 2, is illustrated at 310 in FIG. 3. In this example, the recess 310 extends into a silicon wafer 320 to a depth that is approximately forty six percent (46%) of the total thickness of the oxide 330 (located between unetched nitride portions 340) that results from the LOCOS oxidation process at step 235 of FIG. 2. The nitride portions 340 prevent LOCOS oxidation in the areas of the wafer adjacent the recess 310.

Although the present invention has been described with an exemplary embodiment, various changes and modifications may be suggested to one skilled in the art. It is intended that the present invention encompass such changes and modifications as fall within the scope of the appended claims.

What is claimed is:

1. A method of processing a semiconductor wafer, comprising: producing a structure on the wafer, including performing an oxidation process to produce a recess by oxidation of a surface of an unetched material of the wafer; and using the recess as a positional reference for position of the wafer.

2. The method as claimed in claim 1, wherein said producing step includes forming said positional reference structure to include a recess in said surface.

3. The method as claimed in claim 1, including, before said performing step, producing on the wafer, in a single photolithographic operation, a pattern that defines said positional reference structure on the wafer and also defines active device regions on the wafer.

4. The method as claimed in claim 3, wherein said producing step includes the oxidation process producing on said surface an isolation oxide that isolates the active device regions from one another.

5. The method as claimed in claim 3, wherein said performing step includes the oxidation process consuming a part of the wafer where said positional reference structure is defined.

6. The method as claimed in claim 1, wherein said producing step includes the oxidation process consuming part of the wafer to produce said positional reference structure.

7. The method as claimed in claim 1, wherein said positional reference structure includes a set of stepper alignment marks.

8. A method of processing a semiconductor wafer, comprising: producing a structure on the wafer simultaneously with said producing step, performing an oxidation process which produces a recess by oxidation on a surface of an unetched material of the wafer; and using the recess as a positional reference structure for positioning of the wafer.

9. The method as claimed in claim 8, including, before said performing step, producing on the wafer, in a single photolithographic operation, a pattern that defines said positional reference structure on the wafer and also defines active device regions on the wafer.

10. The method as claimed in claim 9, wherein said performing step includes the oxidation process producing on said surface an isolation oxide that isolates the active device regions from one another.

11. The method as claimed in claim 9, wherein said producing step includes the oxidation process consuming a part of the wafer where said positional reference structure is defined.

12. The method as claimed in claim 8, wherein said producing step includes the oxidation process consuming part of the wafer to produce said positional reference structure.

13. The method as claimed in claim 8, wherein said positional reference structure includes a recess in said surface.

14. The method as claimed in claim 8, wherein said positional reference structure includes a recess in said surface.

15. A method of processing a semiconductor wafer, comprising performing an oxidation process which produces, on a surface of an unetched material of the wafer, an isolation oxide for isolating active device regions on the wafer from one another, simultaneously with said performing step, producing a structure on the water including a recess in the surface of the wafer; and using the recess as a positional reference structure for positioning of the wafer.

16. The method as claimed in claim 15, including, before said performing step, producing on the wafer, in a single photolithographic operation, a pattern that defines said positional reference structure on the wafer and also defines the active device regions on the wafer.

17. The method as claimed in claim 16, wherein said producing step includes the oxidation process consuming a part of the wafer where said positional reference structure is defined.

18. The method as claimed in claim 15, wherein said positional reference structure includes a recess in said surface.

19. The method as claimed in claim 15, wherein said producing step includes the oxidation process consuming part of the wafer to produce said positional reference structure.

20. The method as claimed in claim 15, wherein said positional reference structure includes a set of stepper alignment marks.

* * * * *